(12) United States Patent
Arakawa

(10) Patent No.: US 11,442,361 B2
(45) Date of Patent: Sep. 13, 2022

(54) IMPRINT METHOD, IMPRINT APPARATUS, AND METHOD OF MANUFACTURING ARTICLE

(71) Applicant: CANON KABUSHIKI KAISHA, Tokyo (JP)

(72) Inventor: Tatsuya Arakawa, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/150,267

(22) Filed: Jan. 15, 2021

(65) Prior Publication Data
US 2021/0223689 A1    Jul. 22, 2021

(30) Foreign Application Priority Data

Jan. 20, 2020  (JP) .............................. JP2020-007019

(51) Int. Cl.
*G03F 7/00*  (2006.01)

(52) U.S. Cl.
CPC .................................. *G03F 7/0002* (2013.01)

(58) Field of Classification Search
CPC ......... G03F 7/00; G03F 7/0002; G03F 7/0005
See application file for complete search history.

(56) References Cited

U.S. PATENT DOCUMENTS

2013/0207288 A1*  8/2013  Mikami ............... G03F 7/0002
                                                   264/40.1
2018/0074419 A1*  3/2018  Jung .................... G03F 9/7042

FOREIGN PATENT DOCUMENTS

JP          2016058735 A       4/2016

* cited by examiner

*Primary Examiner* — Nathan H Empie
(74) *Attorney, Agent, or Firm* — Rossi, Kimms & McDowell LLP

(57) ABSTRACT

The present invention provides an imprint method of forming a pattern on an imprint material on a substrate using a mold, comprising: performing preliminary curing of irradiating the imprint material with light to cure the imprint material to a first target hardness; and performing main curing of irradiating the imprint material with curing light to cure the imprint material to a second target hardness, wherein the preliminary curing includes a first process of irradiating the imprint material with first light to which the imprint material has first reaction sensitivity, and a second process of irradiating the imprint material with second light to which the imprint material has second reaction sensitivity lower than the first reaction sensitivity, and is controlled such that an end timing of the second process is later than an end timing of the first process.

10 Claims, 11 Drawing Sheets

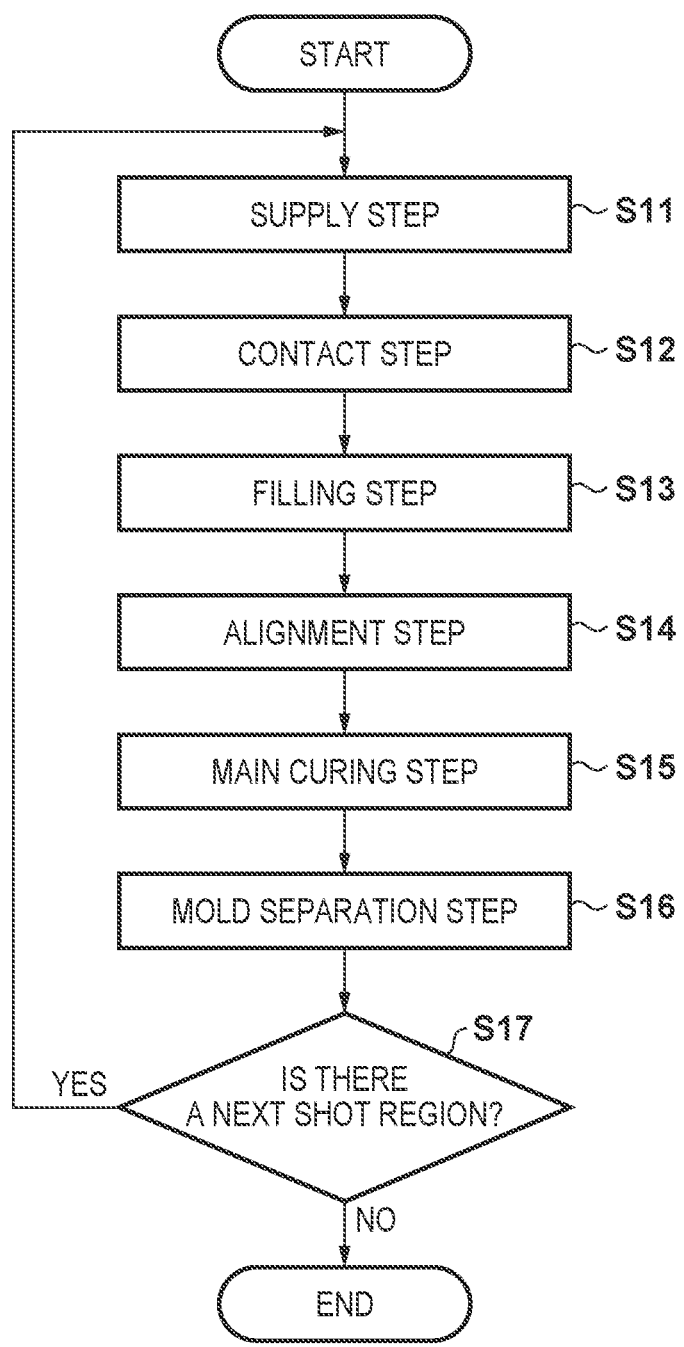

IMPRINT METHOD, IMPRINT APPARATUS, AND METHOD OF MANUFACTURING ARTICLE

BACKGROUND OF THE INVENTION

Field of the Invention

The present invention relates to an imprint method, an imprint apparatus, and a method of manufacturing an article.

Description of the Related Art

As a lithography apparatus for manufacturing a semiconductor device, a MEMS, or the like, there is known an imprint apparatus that molds an imprint material on a substrate using a mold. In the imprint apparatus, a liquid imprint material is supplied onto a substrate, and a mold is brought into contact with the imprint material on the substrate. Thereafter, the imprint material is cured (solidified) in that state, and the mold is separated from the cured imprint material. With this operation, a pattern of the imprint material can be formed on the substrate.

In the imprint technique, before curing the imprint material, alignment between the mold and the substrate is executed in a state in which the mold is in contact with the imprint material on the substrate. In the alignment, the alignment accuracy between the mold and the substrate may be decreased due to external disturbance such as a vibration from the floor on which the imprint apparatus is installed. Japanese Patent Laid-Open No. 2016-58735 proposes a method in which, in alignment between a mold and a substrate in a state in which the mold is in contact with an imprint material on the substrate, the alignment accuracy is improved by irradiating the imprint material with light to increase the viscosity of the imprint material.

In the alignment between the mold and the substrate, in order to accurately control the viscosity of the imprint material on the substrate, for example, it is preferable to gradually increase the viscosity of the imprint material using light having a wavelength to which the sensitivity of the imprint material is low. However, if such light is used, it requires a long time to increase the viscosity of the imprint material on the substrate, and this can be disadvantageous in throughput.

SUMMARY OF THE INVENTION

The present invention provides, for example, a technique advantageous in achieving both the alignment accuracy between a mold and a substrate and the throughput.

According to one aspect of the present invention, there is provided an imprint method of forming a pattern on an imprint material on a substrate using a mold, comprising: performing alignment between the mold and the substrate in a state in which the mold is in contact with the imprint material on the substrate; performing preliminary curing of, in parallel with the alignment or before the alignment, irradiating the imprint material with light to cure the imprint material to a first target hardness; and performing main curing of, after the alignment, irradiating the imprint material with curing light to cure the imprint material to a second target hardness higher than the first target hardness, wherein the preliminary curing includes a first process of irradiating the imprint material with first light to which the imprint material has first reaction sensitivity, and a second process of irradiating the imprint material with second light to which the imprint material has second reaction sensitivity lower than the first reaction sensitivity, and is controlled such that an end timing of the second process is later than an end timing of the first process.

Further features of the present invention will become apparent from the following description of exemplary embodiments with reference to the attached drawings.

BRIEF DESCRIPTION OF THE DRAWINGS

FIG. 2 is a flowchart illustrating an imprint process.

DESCRIPTION OF THE EMBODIMENTS

Figure 1:
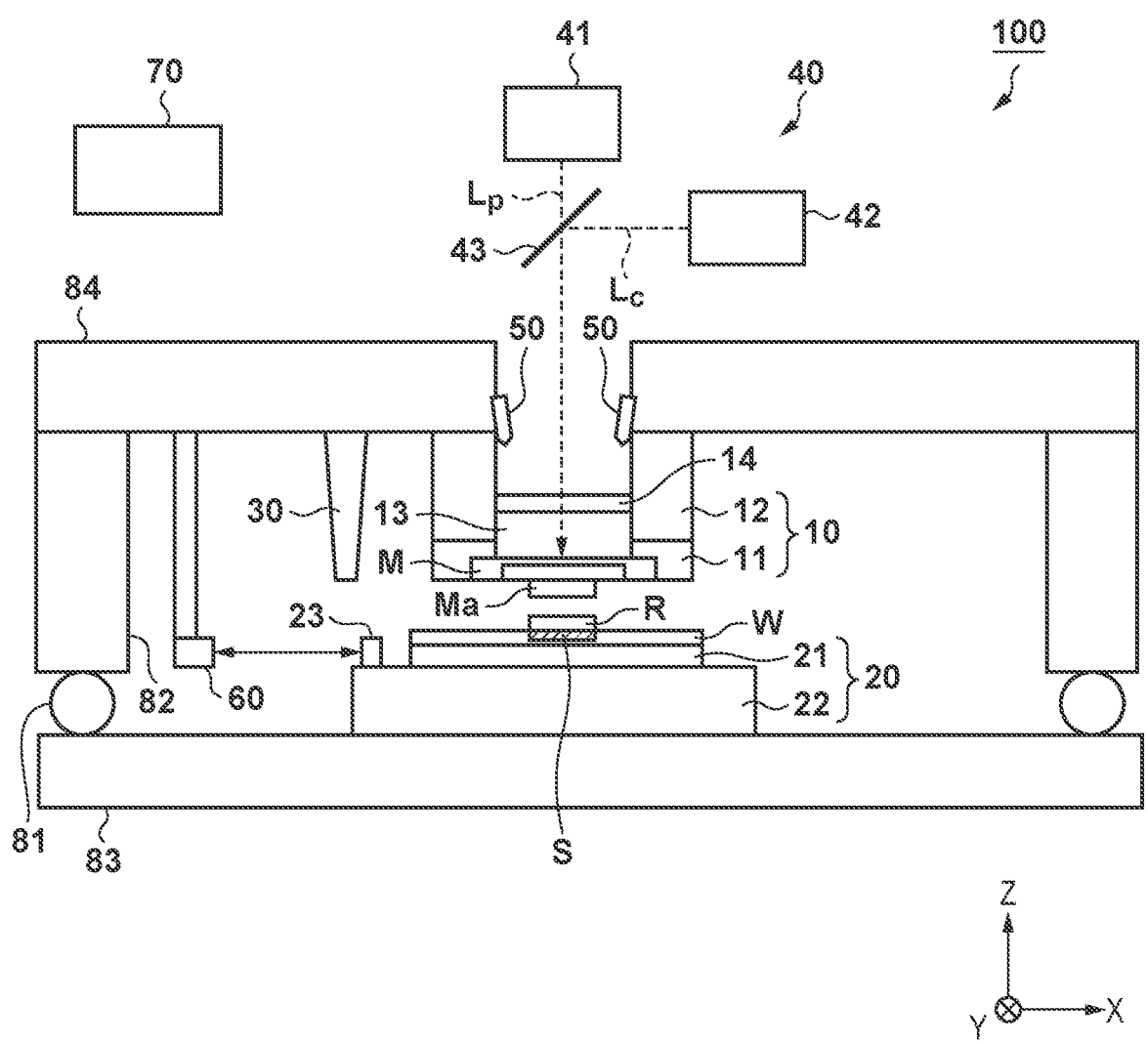
FIG. 1 is a schematic view showing the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Assume that in the following embodiments, two directions orthogonal to each other in a plane direction parallel to the surface of a substrate (a direction along the surface of the substrate) are defined as an X direction and a Y direction, respectively, and a direction perpendicular to the surface of the substrate (a direction along the optical axis of light incident on the substrate) is defined as a Z direction.

First Embodiment

The first embodiment according to the present invention will be described. An imprint apparatus is an apparatus that forms a pattern of a cured product of an imprint material onto which a pattern with convex and concave portions on a mold is transferred by bringing an imprint material supplied onto a substrate into contact with a mold and applying energy for curing the imprint material. For example, the imprint apparatus supplies a liquid imprint material onto a substrate, and cures the imprint material in a state in which a mold on which a pattern with convex and concave portions has been formed is in contact with the imprint material on the substrate. Then, the imprint apparatus increases the spacing between the mold and the substrate, thereby separating the mold from the cured imprint material. Thus, the pattern of the mold can be transferred to the imprint material on the substrate. Such a series of processes is called an "imprint process", and is performed for each of a plurality of shot regions on the substrate.

As the imprint material, a curable composition (to be also referred to a resin in an uncured state) that is cured by receiving curing energy is used. As the curing energy, an electromagnetic wave, heat, or the like is used. The electromagnetic wave is light selected from the wavelength range of 10 nm (inclusive) to 1 mm (inclusive), for example, infrared light, a visible light beam, ultraviolet light, or the like.

The curable composition is a composition cured by light irradiation or heating. A photo-curable composition cured by light contains at least a polymerizable compound and a photopolymerization initiator, and may contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component.

The imprint material is applied in a film shape onto the substrate by a spin coater or a slit coater. Alternatively, the imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

[Arrangement of Imprint Apparatus]

FIG. 1 is a schematic view showing the arrangement of an imprint apparatus 100 according to this embodiment. The imprint apparatus 100 according to this embodiment includes, for example, an imprint head 10 (mold holding unit), a substrate stage 20, a supply device 30, a curing device 40, a measurement device 50, a detection device 60, and a controller 70. The controller 70 is formed by a computer including a CPU, a memory, and the like, and connected to each unit of the imprint apparatus 100 via a line to control each unit of the imprint apparatus 100 (control an imprint process) in accordance with a program and the like. Here, the imprint head 10 is fixed to a bridge plate 84 supported by a base plate 83 via a vibration isolator 81 and a column 82. The substrate stage 20 is configured to be movable on the base plate 83. The vibration isolator 81 is a mechanism for, for example, reducing a vibration transmitted to the bridge plate 84 from the floor on which the imprint apparatus 100 is installed.

A mold M is usually formed from a material capable of transmitting ultraviolet light, such as quartz. In the mold M, a pattern with convex and concave portions to be transferred to an imprint material R on a substrate is formed in a partial region (pattern region Ma) located on the substrate side surface and protruding toward the substrate side. As a substrate W, glass, ceramic, a metal, a semiconductor, a resin, or the like is used. A member made of a material different from that of the substrate may be formed on the surface of the substrate, as needed. More specifically, the substrate W is a silicon wafer, a semiconductor compound wafer, silica glass, or the like. An adhesive layer may be provided before the application of an imprint material to improve the adhesiveness between the imprint material and the substrate, as needed.

The imprint head 10 can include a mold chuck 11 that holds the mold M by, for example, a vacuum force or the like, and a mold driving unit 12 that drives the mold M in the Z direction so as to change the spacing between the mold M and the substrate W. By driving the mold M in the Z direction by the imprint head 10, it is possible to execute a contact process of bringing the mold M into contact with the imprint material R on the substrate and a mold separation process of separating the mold M from the cured imprint material R. The driving direction is not limited to the Z direction, and the imprint head 10 may be configured to drive the mold M in the X and Y directions and the θ direction (the rotation direction around the Z axis).

In the imprint head 10 according to this embodiment, a space 13 through which light emitted from the curing device 40 passes is provided. This space 13 is partitioned by a light-transmitting member 14. When the mold M is held by the imprint head 10 (mold chuck 11), the space 13 becomes a substantially sealed space. Therefore, in the contact process or the mold separation process, by adjusting the internal pressure in the space 13 by a pressure adjustment unit (not shown), it is possible to deform the mold M (pattern region Ma) into a convex shape bending toward the substrate W. For example, by deforming the mold M into the convex shape in the contact process, the pattern region Ma can be gradually brought into contact with the imprint material R, so that it is possible to decrease trapping of air in the concave portion of the pattern formed on the mold M.

The substrate stage 20 can include a substrate chuck 21 that holds a substrate by, for example, a vacuum force or the like, and a moving unit 22 that can move in the X and Y directions on the base plate 83. The substrate W is driven in the X and Y directions by moving the substrate stage 20 (moving unit 22) in the X and Y directions, so that it is possible to execute positioning (relative position) between the mold M and the substrate M and positioning between the supply device 30 and the substrate W. The moving directions of the substrate stage 20 are not limited to the X and Y directions, and the substrate stage 20 may be configured to drive the substrate W in the Z direction or the θ direction.

The supply device 30 (a discharge device or a dispenser) supplies the imprint material R onto the substrate arranged below by the substrate stage 20. In this embodiment, a resin that undergoes a polymerization reaction by light irradiation is used as the imprint material R. For example, when the supply device 30 discharges the imprint material R as a plurality of droplets in a state in which the substrate W is relatively moved with respect to the supply device 30 by the substrate stage 20, the imprint material R can be supplied onto the substrate W (a target shot region S).

The curing device 40 (light irradiation device) irradiates the imprint material R on the substrate W with light for causing a polymerization reaction of an imprint material, thereby curing the imprint material. The curing device 40 according to this embodiment can include, for example, a preliminary curing unit 41 and a main curing unit 42. The preliminary curing unit 41 emits light (preliminary light Lp) for curing the imprint material R to a first target hardness in a preliminary curing step to be described later. In this embodiment, the preliminary light Lp emitted from the preliminary curing unit 41 is transmitted through a half mirror 43 and irradiates the imprint material R on the substrate. The main curing unit 42 emits curing light Lc that cures the imprint material to a second target hardness in a main curing step to be described later. In this embodiment, the curing light Lc emitted from the main curing unit 42 is reflected by the half mirror 43 and irradiates the imprint material R on the substrate. The half mirror 43 can be formed by a dichroic mirror or the like that transmits the preliminary light Lp but reflects the curing light Lc.

Here, the second target hardness (main curing) of the imprint material R can be defined as the degree of curing capable of solidifying the imprint material R. For example, the second target hardness is defined as the degree of curing the imprint material R at which, even after the mold M is separated from the imprint material R in the mold separation step, the pattern shape of the imprint material R obtained by transferring the pattern with convex and concave portions of the mold M can be maintained.

The first target hardness of the imprint material R can be defined as the degree of curing the imprint material R to obtain the hardness (viscosity) higher than that of the imprint material R at the time of supply onto the substrate by the supply device 30 but lower than the second target hardness. That is, the first target hardness can be defined as the degree of curing the imprint material R so as to have the fluidity higher than the second target hardness but lower than the fluidity of the imprint material R at the time of supply onto the substrate by the supply device 30. As long as the mold M and the substrate W can be relatively driven in a state in which the mold M is in contact with the imprint material R on the substrate, the first target hardness is arbitrarily set within a range higher than the hardness of the imprint material R at the time of supply onto the substrate and lower than the second target hardness. For example, the first target hardness can be set to a predetermined value within a range of 20% to 80% of the second target hardness, preferably a predetermined value within a range of 40% to 60% of the second target hardness.

The measurement device 50 includes, for example, a TTM (Through The Mold) scope that detects a mark provided on the mold M and a mark provided on the substrate W, and measures the positional relationship between the mark of the mold M and the mark of the substrate W. Thus, the controller 70 can execute alignment between the mold M and the substrate W based on the positional relationship between the mark of the mold M and the mark of the substrate W measured by the measurement device 50.

The detection device 60 detects the relative position between the mold M and the substrate W in the X and Y directions. For example, the detection device 60 includes a laser interferometer, and irradiates a reflector 23 provided on the substrate stage 20 with a laser beam to detect the position of the substrate stage 20 using the laser bean reflected by the reflector 23. In this embodiment, the detection device 60 is fixed to the bridge plate 84 to which the imprint head 10 (mold M) is fixed. Therefore, the detection device 60 can detect the relative position between the imprint head 10 (mold M) and the substrate stage 20 (substrate W) based on the position of the substrate stage 20 (substrate W). Further, the measurement device 50 may be configured to measure the positional relationship by detecting a mark formed of the mold and a mark formed on the substrate via a relay optical system provided in the imprint apparatus. Thus, the controller 70 can control the relative position between the imprint head 10 (mold M) and the substrate stage 20 (substrate W) based on the detection result of the detection device 60.

[Imprint Process]

Next, the imprint process performed in the imprint apparatus 100 according to this embodiment will be described. FIG. 2 is a flowchart illustrating the imprint process performed in the imprint apparatus 100 according to this embodiment. Each step of the flowchart shown in FIG. 2 can be controlled by the controller 70. The flowchart shown in FIG. 2 is started in a state in which the mold M is held by the imprint head 10 and the substrate W is held by the substrate stage 20.

In step S11, the controller 70 causes the supply device 30 to discharge the imprint material R while causing the substrate stage 20 to relatively move the supply device 30 and the substrate W, thereby supplying the imprint material R onto the target shot region S of the substrate W (supply step). When the supply process is completed, the controller 70 causes the substrate stage 20 to drive the substrate W so as to arrange the target shot region S below the mold M (pattern region Ma). In step S12, the controller 70 causes the imprint head 10 to drive the mold M in the −Z direction to decrease the spacing between the mold M and the substrate W, thereby bringing the mold M into contact with the imprint material R on the substrate (contact step). In step S13, the controller 70 waits until a predetermined time elapses so as to allow the pattern concave portion of the mold M to be filled with the imprint material R (filling step).

In step S14, the controller 70 executes alignment between the mold M and the substrate W in a state in which the mold M is in contact with the imprint material R on the substrate (alignment step). In the alignment step, the measurement device 50 measures the positional relationship between the mark of the mold M and the mark of the substrate W and, based on the measurement result, the relative position of the mold M and the substrate W can be controlled such that the mark of the mold M and the mark of the substrate W have a target positional relationship.

Figure 3A:
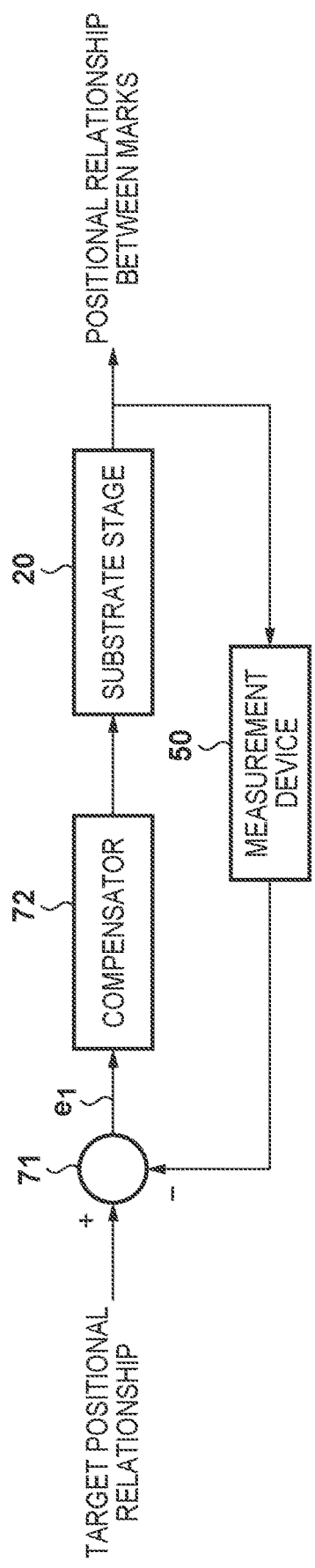
FIG. 3A is a block diagram showing an example of controlling the relative position between a mold and a substrate in an alignment step.

FIG. 3A is a block diagram showing an example of controlling the relative position between the mold M and the substrate W in the alignment step. In FIG. 3A, a subtractor 71 and a compensator 72 are components of the controller 70. The subtractor 71 obtains information of the positional relationship between the mark of the mold M and the mark of the substrate W measured by the measurement device 50, calculates a deviation $e_1$ between the measured positional relationship and the target positional relationship, and outputs the deviation $e_1$ to the compensator 72. The compensator 72 includes, for example, a PID compensator. The compensator 72 determines an operation command value (manipulated variable) for driving the substrate stage 20 so as to decrease the deviation $e_1$ (for example, to be zero) calculated by the subtractor 71, and gives the determined operation command value to the substrate stage 20. Thus, it is possible to control the relative position between the mold M and the substrate W such that the mark of the mold M and the mark of the substrate W have the target positional relationship.

In step S15, the controller 70 causes the curing device 40 (main curing unit 42) to irradiate the imprint material R with the curing light Lc in the state in which the mold M is in contact with the imprint material R on the substrate, thereby curing the imprint material R to the second target hardness (main curing step). In the main curing step, the relative position between the mold M and the substrate W obtained finally in the alignment step is set as the target relative position, and the relative position between the mold M and the substrate W can be controlled so as to maintain the target relative position. The control of the relative position may be executed by controlling the position of at least one of the mold M and the substrate W. For example, the target relative position between the mold M and the substrate W may be maintained by making the position of the substrate stage 20 holding the substrate W constant. That is, the control mode of the relative position between the mold M and the substrate W is switched between the alignment step and the main curing step.

Figure 3B:
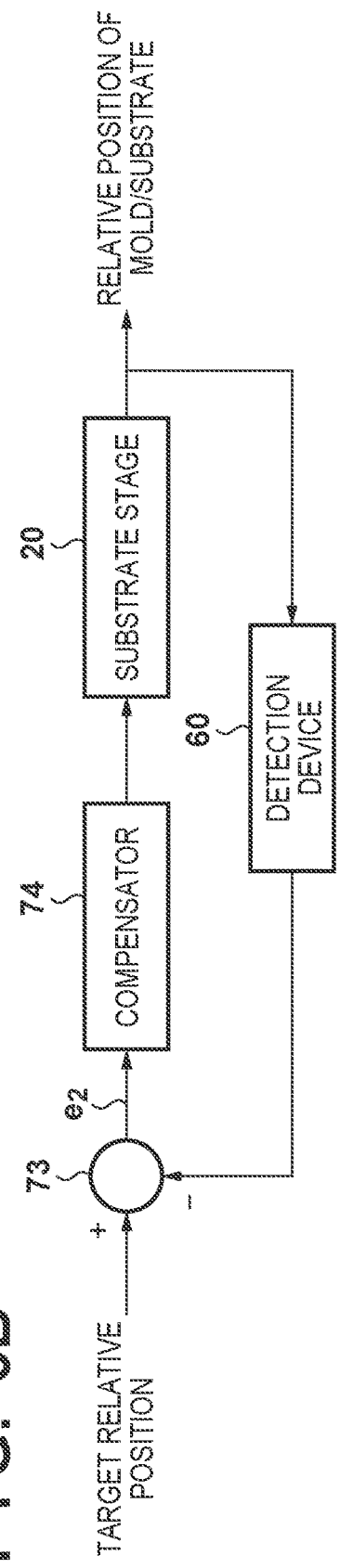
FIG. 3B is a block diagram showing an example of controlling the relative position between the mold and the substrate in a main curing step.

FIG. 3B is a block diagram showing an example of controlling the relative position between the mold M and the substrate W in the main curing step. In FIG. 3B, a subtractor 73 and a compensator 74 are components of the controller 70. First, the controller 70 obtains information of the relative position between the mold M and the substrate W obtained finally in the alignment step, and sets the obtained relative position as the target relative position. The subtractor 73 obtains information of the relative position between the mold M and the substrate W detected by the detection device 60, calculates a deviation $e_2$ between the detected relative position and the target relative position, and outputs the deviation $e_2$ to the compensator 74. The compensator 74 includes, for example, a PID compensator. The compensator 74 determines an operation command value (manipulated variable) for driving the substrate stage 20 so as to decrease the deviation $e_2$ (for example, to be zero) calculated by the subtractor 73, and gives the determined operation command value to the substrate stage 20. Thus, it is possible to control the relative position between the mold M and the substrate W so as to maintain the relative position between the mold M and the substrate W obtained finally in the alignment step.

In step S16, the controller 70 causes the imprint head 10 to drive the mold M in the +Z direction to increase the spacing between the mold M and the substrate W, thereby separating the mold M from the imprint material R cured to the second target hardness (mold separation step). In step S17, the controller 70 determines whether a shot region (next shot region) to undergo the imprint process next exists on the substrate. If the next shot region exists, the process returns to step S11, and if no next shot region exists, the process is terminated.

[Preliminary Curing Step]

In the contact step between the mold M and the imprint material R on the substrate (step S12), it is preferable that the imprint material R can be easily spread on the substrate. Accordingly, it is preferable that the imprint material R has a low viscosity (that is, high fluidity). On the other hand, in the alignment step between the mold M and the substrate W (step S14), since the alignment accuracy between the mold M and the substrate W can be decreased due to the influence of external disturbance such as a vibration from the floor, it is preferable to increase the viscosity of the imprint material R to decrease the influence of external disturbance. In the imprint apparatus 100 according to this embodiment, by irradiating the imprint material R on the substrate with the preliminary light Lp in parallel with or before the alignment step, the preliminary curing step of curing the imprint material R to the first target hardness is executed. Thus, the relative position between the mold M and the substrate W in the alignment step becomes less likely to change, so that the alignment accuracy between the mold M and the substrate W can be improved.

Figure 4A:
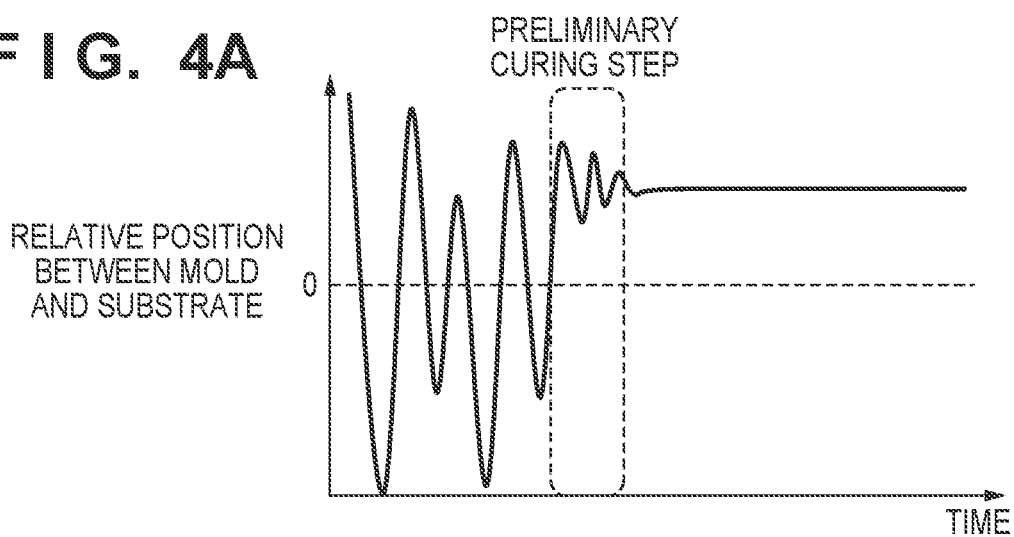
FIGS. 4A to 4C are graphs for explaining the influence of external disturbance in the alignment step.
Figure 4B:
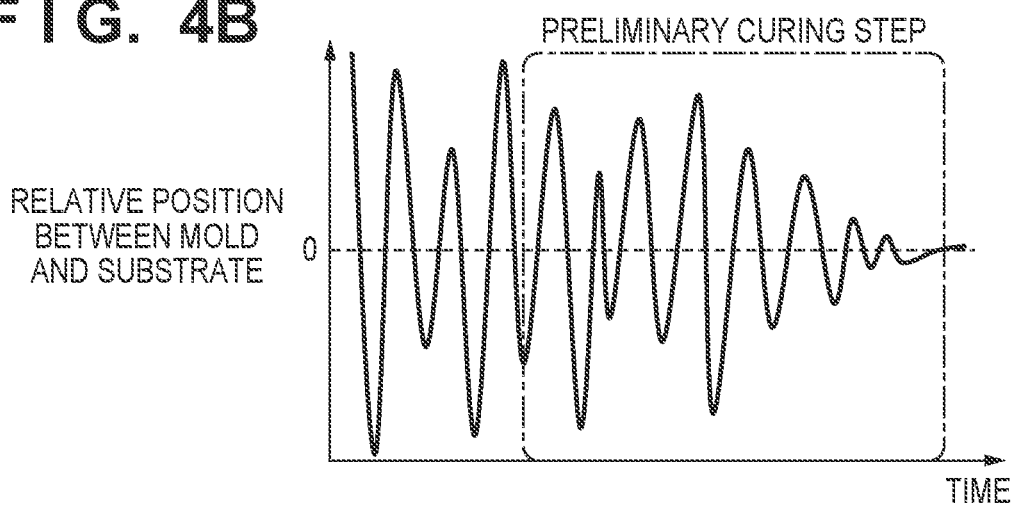

However, if only light such as the curing light Lc to which the reaction sensitivity of the imprint material R is relatively high is used in the preliminary curing step, the curing speed of the imprint material R is high, and it can be difficult to accurately control the hardness of the imprint material R. In this case, for example, as shown in FIG. 4A, the imprint material R may be cured to the first target hardness in a state in which an offset (to be also referred to as a positional shift or a steady-state deviation) is generated in the relative position between the mold M and the substrate W due to the influence of external disturbance (a vibration or the like). In the state in which the imprint material R has been cured to the first target hardness, it is difficult to change the relative position between the mold M and the substrate W, so that it can be difficult to reduce the offset. On the other hand, if only the light to which the reaction sensitivity of the imprint material R is relatively low is used in the preliminary curing step, it is possible to accurately control the hardness of the imprint material R but, as shown in FIG. 4B, the curing speed of the imprint material R is low, and this can be disadvantageous in throughput.

Figure 4C:
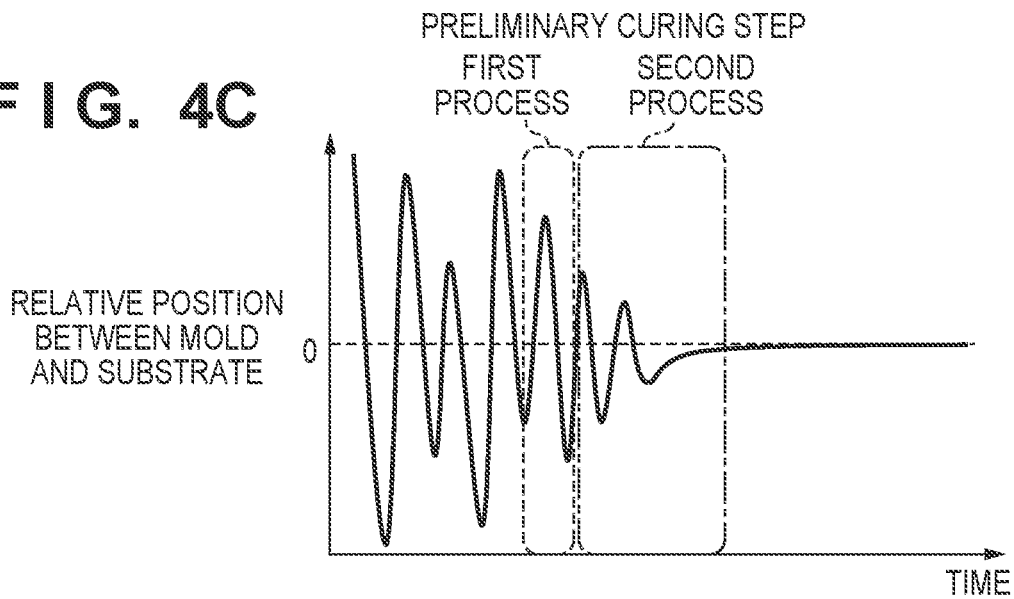
Figure 5:
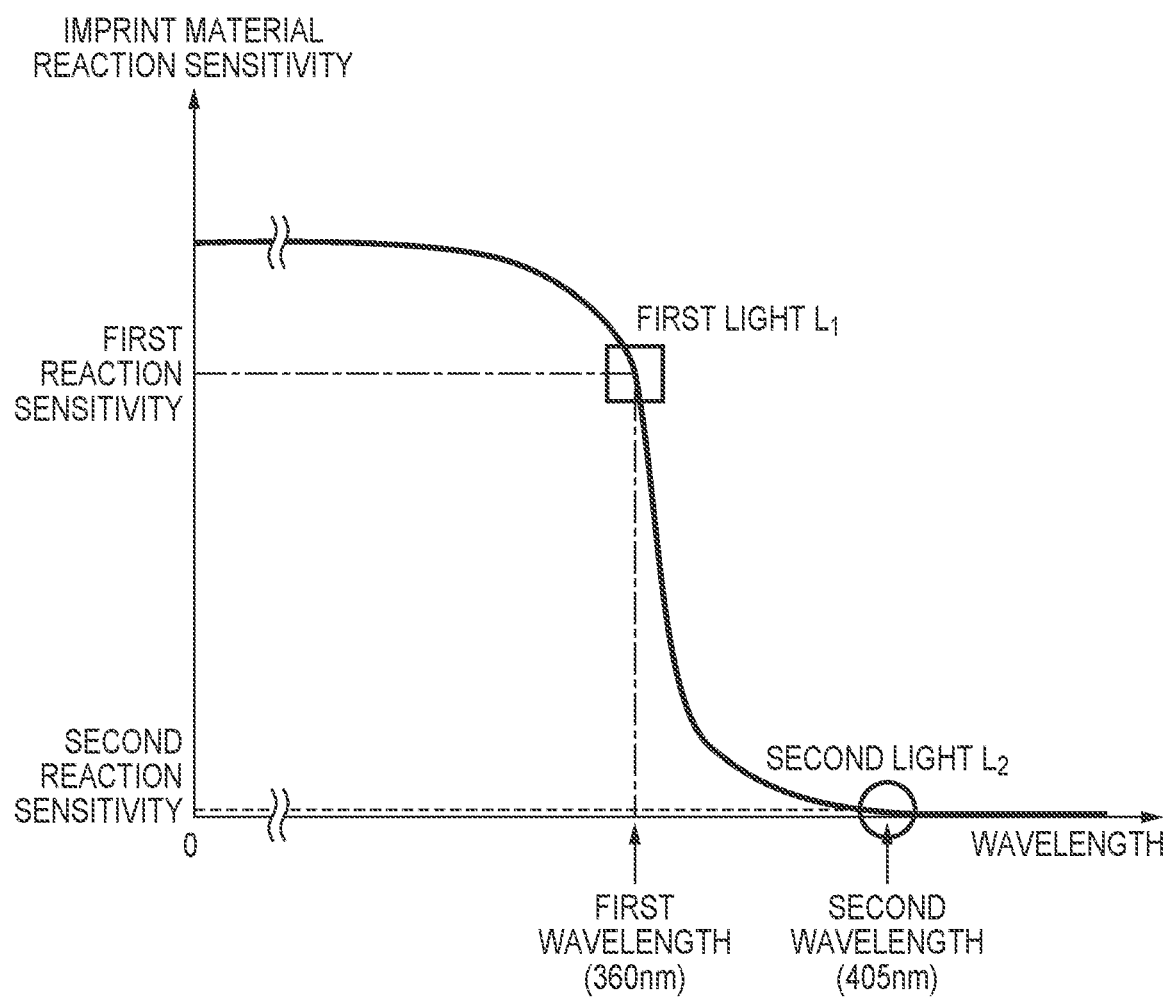
FIG. 5 is a graph showing the relationship between the wavelength of light and the reaction sensitivity of the imprint material.

Therefore, the preliminary curing step according to this embodiment includes a first process of irradiating the imprint material R with first light $L_1$ as the preliminary light Lp, and a second process of irradiating the imprint material with second light $L_2$ as the preliminary light Lp. Further, the preliminary curing step is controlled such that the end timing of the second process is later than the end timing of the first process. As shown in FIG. 5, the first light $L_1$ is light having a first wavelength (for example, 360 nm) to which the imprint material R has first reaction sensitivity, and the second light $L_2$ is light having a second wavelength (for example, 405 nm) to which the imprint material R has second reaction sensitivity lower than the first reaction sensitivity. FIG. 5 is a graph showing the relationship between the wavelength of light and the reaction sensitivity of the imprint material R. By controlling the preliminary curing step using the first light $L_1$ and the second light $L_2$ as described above, as shown in FIG. 4C, it is possible to achieve both the alignment accuracy between the mold M and the substrate and the throughput. Here, the first light $L_1$ may be the light to which the imprint material R has the reaction sensitivity equal to the reaction sensitivity to the curing light Lc, or may be light to which the imprint material R has the reaction sensitivity lower than the reaction sensitivity to the curing light Lc. The first light $L_1$ may have the same wavelength as the curing light Lc.

Figure 6:
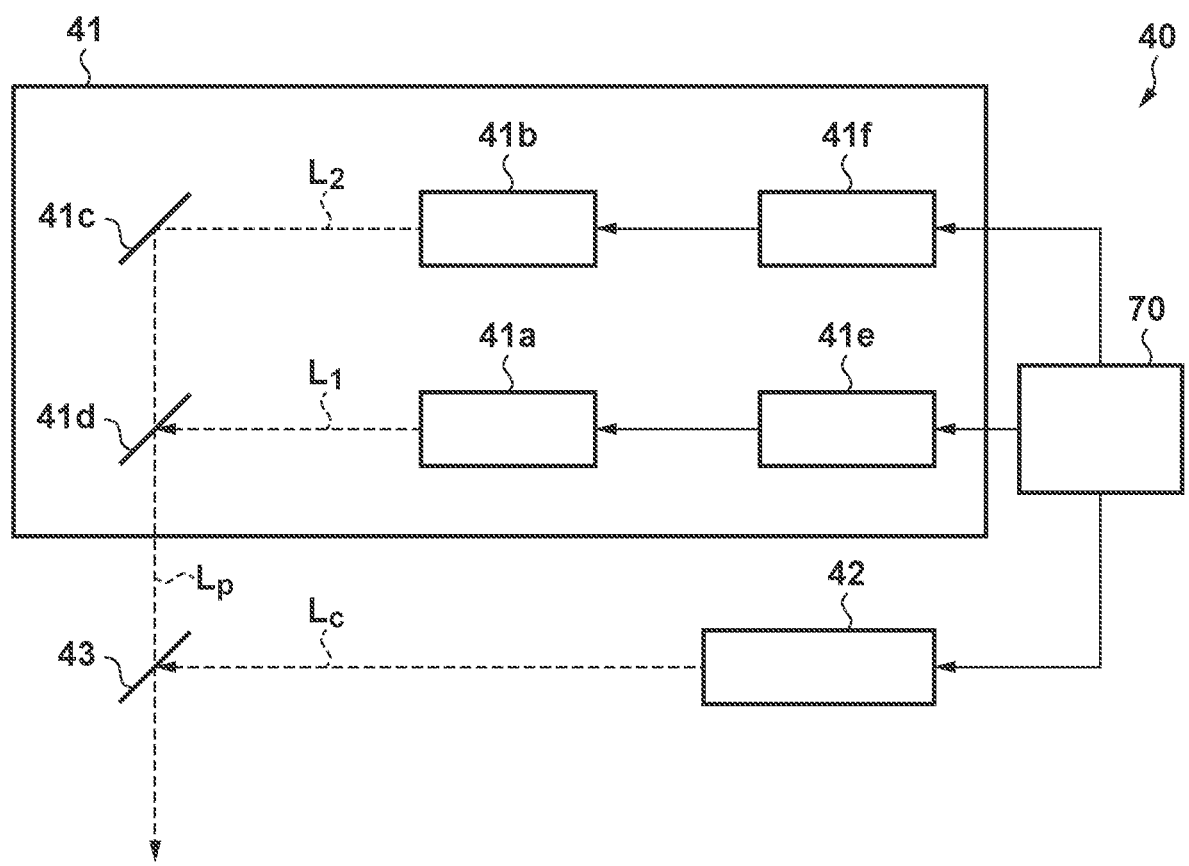
FIG. 6 is a schematic view showing an arrangement example of a curing device according to the first embodiment.

Next, the arrangement of the preliminary curing unit 41 will be described. FIG. 6 is a schematic view showing an arrangement example of the curing device 40 (the preliminary curing unit 41 and the main curing unit 42). The preliminary curing unit 41 according to this embodiment can include a first light source 41a that emits the first light $L_1$, a second light source 41b that emits the second light $L_2$, a mirror 41c, and a half mirror 41d. Each of the first light source 41a and the second light source 41b can be formed by a mercury lamp, an LED, or the like. The half mirror 41d can be formed by, for example, a dichroic mirror or the like that reflects the first light $L_1$ and transmits the second light $L_2$. The first light $L_1$ emitted from the first light source 41a is reflected by the half mirror 41d and emitted from the preliminary curing unit 41 as the preliminary light Lp. On the other hand, the second light $L_2$ emitted from the second light source 41b is reflected by the mirror 41c, transmitted through the half mirror 41d, and emitted from the preliminary curing unit 41 as the preliminary light Lp.

The preliminary curing unit 41 can further include a first driving unit 41e that drives the first light source 41a in accordance with an instruction of the controller 70, and a second driving unit 41f that drives the second light source 41b in accordance with an instruction of the controller 70.

The controller 70 may input, as command values, the drive current values of the first light source 41a and the second light source 41b to the first driving unit 41e and the second driving unit 41f, respectively. Alternatively, the controller 70 may input, as a command value, the target intensity of light to be emitted from each light source. In a case in which the drive current value is input as the command value, a constant current circuit for adjusting the drive current of the light source in accordance with the command value is preferably provided in each of the first driving unit 41e and the second driving unit 41f. On the other hand, in a case in which the target intensity of light is input as the command value, each of the first driving unit 41e and the second driving unit 41f may detect the intensity of the light emitted from the light source by a sensor (for example, a photodiode), and adjust the drive current of the light source based on the detection result. With the arrangement according to this embodiment, it is possible to independently control (operate) the first light source 41a and the second light source 41b. Accordingly, it is possible to turn on or off the light sources at the same time, or turn on only one of the light sources.

Figure 7:
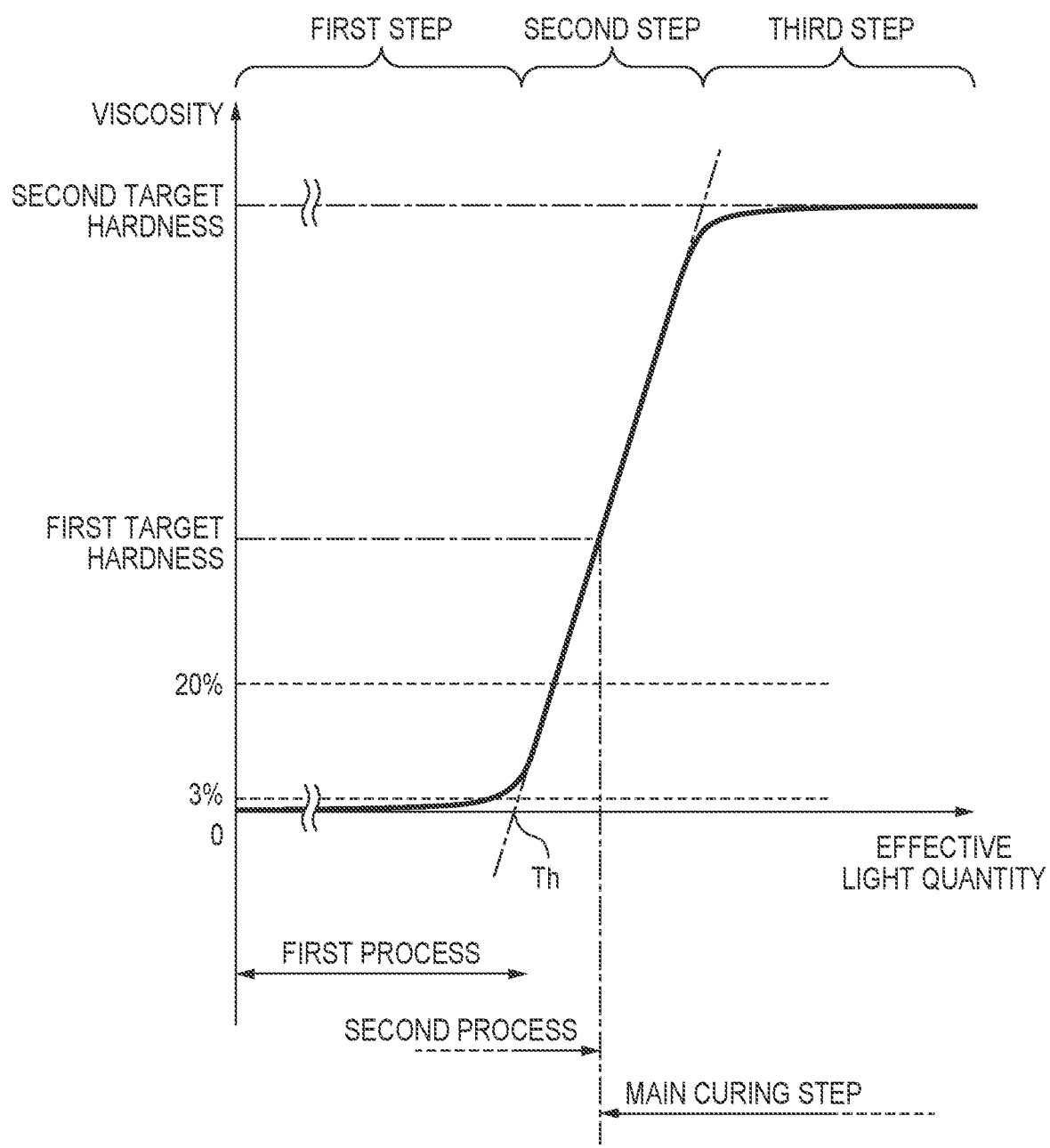
FIG. 7 is a graph showing the relationship between the effective light quantity and the viscosity in the imprint material.

Next, a control method of the preliminary light Lp in the preliminary curing step will be described. FIG. 7 is a graph showing the relationship between the effective light quantity and the viscosity in the imprint material R (the characteristic of the imprint material R). The effective light quantity (Dose) is the integrated exposure light quantity of light that contributes to the reaction of the imprint material R. As shown in FIG. 7, the characteristic of the imprint material R has three stages according to the increase of the effective light quantity. The first stage is also referred to as an "unsensable region". In this stage, the viscosity hardly changes according to the effective light quantity, and when the effective light quantity has reached a threshold value Th, the first stage transitions to the second stage. The second stage is a stage in which the viscosity increases according to the increase of the effective light quantity. In this stage, the change rate of the viscosity with respect to the change in effective light quantity is five times or more (ten times or more depending on the imprint material) as compared to that in the first stage. In this embodiment, the viscosity of the imprint material R can linearly increase according to the increase of the effective light quantity in the second stage. The third stage is a stage in which the imprint material R reaches the second target hardness and is finally cured. Here, as expressed by the following equation, the effective light quantity (Dose) can be obtained using the intensity (i) of the light applied to the imprint material R, the reaction sensitivity (r) of the imprint material R to the light, and the light irradiation time (t) of the imprint material R.

$$\text{Effective light quantity (Dose)} = \text{light intensity } (i) \times \text{reaction sensitivity } (r) \times \text{irradiation time } (t)$$

In the first stage of the characteristic of the imprint material R as described above, it is preferable to use the first light $L_1$ to which the sensitivity of the imprint material R is relatively high to shorten the light irradiation time as much as possible, thereby improving the throughput. On the other hand, if the first light $L_1$ is used in the second stage, the viscosity of the imprint material R increases rapidly, so that it is difficult to accurately control the hardness of the imprint material R to the first target hardness. Therefore, in the second stage, it is preferable to use the second light $L_2$ to which the sensitivity of the imprint material R is relatively low and control (adjust) the hardness of the imprint material R.

Accordingly, in the preliminary curing step according to this embodiment, the viscosity of the imprint material R before the irradiation of the first light $L_1$ (for example, the supply step) is used as a reference, and the first process can be controlled such that the increase of the viscosity of the imprint material R caused by the irradiation of the first light $L_1$ falls within a range of 3% to 20%. For example, the first process may be controlled such that the first process ends when the effective light quantity obtained by the first light $L_1$ has reached the threshold value Th. After the first process ends, the hardness of the imprint material R is controlled to be the first target hardness using the second light $L_2$ alone. By controlling the preliminary curing step as described above, it is possible to achieve both the alignment accuracy between the mold M and the substrate and the throughput.

[Control Examples of First Process and Second Process]

Figure 8:
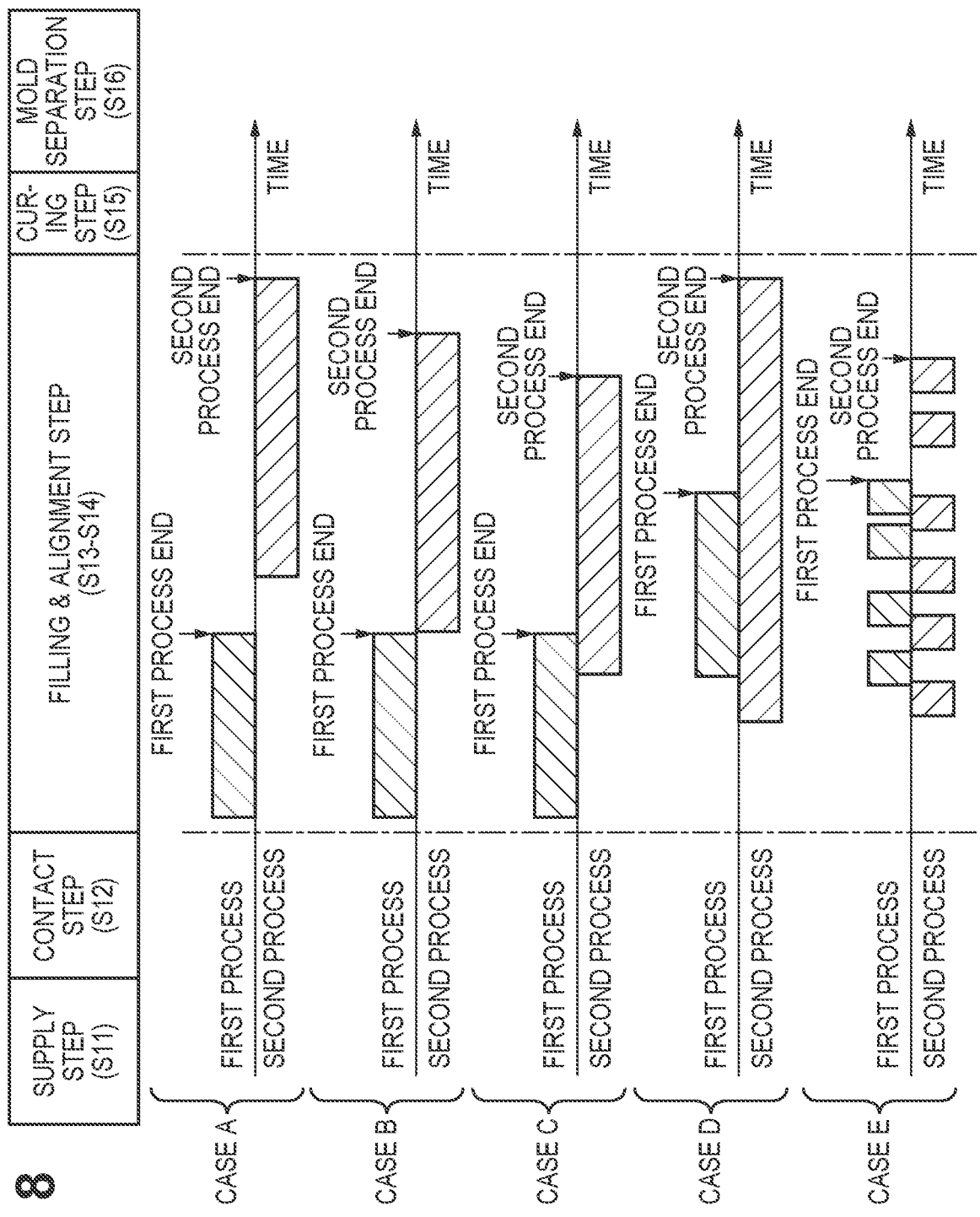
FIG. 8 is a timing chart showing a preliminary curing step (a first process and a second process) during the imprint process according to the first embodiment.

Control examples of the first process and the second process in the preliminary curing step will be described. FIG. 8 is a timing chart showing the execution timing of the preliminary curing step (the first process and the second process) during the imprint process, and shows the execution timings of some steps in the flowchart shown in FIG. 2. The example shown in FIG. 8 shows the filling step and the alignment step as a "filling/alignment step", and shows a case in which the time of the "filling/alignment step" is sufficiently long with respect to the time for obtaining the effective light quantity for curing the imprint material R to the first target hardness.

Each of case A and case B in FIG. 8 shows a control example in which the second process is started after the first process ends. In case A shown in FIG. 8, the second process is started after a predetermined time interval has elapsed after the first process ends. In the period from the end of the first process to the start of the second process, the imprint material R is not irradiated with the preliminary light Lp but the reaction of the imprint material R advances, so that the viscosity of the imprint material R may be increased as a transient response. In case B shown in FIG. 8, the second process is started without any time interval after the first process ends. In this case, as compared to the control example in case A shown in FIG. 8, the total time required for the preliminary curing step can be shortened, and the increase of the viscosity of the imprint material R due to the transient response can be avoided, so that it is possible to accurately control the viscosity (hardness) of the imprint material R. In either of case A and case B shown in FIG. 8, the preliminary curing step can be controlled such that the end timing of the second process is later than the end timing of the first process.

Each of case C and case D in FIG. 8 shows a control example in which the second process is started such that at least a part of the period of the second process temporally overlaps with the first process. In case C shown in FIG. 8, the second process is started in the middle of the first process, and in case D shown in FIG. 8, the second process is started before the first process is started. Each of these control examples can be implemented since the first light source 41a that emits the first light $L_1$ and the second light source 41b that emits the second light $L_2$ are independently provided in the preliminary curing unit 41, and this is advantageous in shortening the total time required for the preliminary curing step. In each of these control examples, the controller 70 preferably estimates, based on the characteristic information of the imprint material R as shown in FIG. 7 and the effective light quantity obtained by the first light $L_1$, the change of the viscosity of the imprint material R caused by the first process, and control the second process based on the estimation result. In either of case C and case D shown in FIG. 8, the preliminary curing step can be controlled such that the end timing of the second process is later than the end timing of the first process.

Case E in FIG. 8 shows a control example in which the imprint material R is intermittently irradiated with the first light $L_1$ in the first process and the imprint material R is also intermittently irradiated with the second light $L_2$ in the second process. In this control example, the start timings of the first process and the second process are not restricted, but the preliminary curing step can be controlled such that the end timing of the second process is later than the end timing of the first process. In this control example, irradiation of the first light $L_1$ and irradiation of the second light $L_2$ may be alternately executed. As one example, one cycle including irradiation of the first light $L_1$ and irradiation of the second light $L_2$ may be repeatedly executed. In this case, the viscosity of the imprint material R may be measured for each cycle, and irradiation of the first light $L_1$ and the irradiation of the second light $L_2$ may be controlled based on the measurement result. The viscosity of the imprint material R can be measured by, for example, detecting a force obtained when relatively moving the mold M and the substrate W by the substrate stage 20, or detecting the relative moving amount between the mold M and the substrate W obtained when the substrate stage 20 is driven with a predetermined force.

As has been described above, the imprint apparatus 100 according to this embodiment executes the preliminary curing step of curing the imprint material R to the first target hardness in parallel with or before the alignment step. The preliminary curing step includes the first process of irradiating the imprint material R with the first light $L_1$ to which the imprint material R has the first reaction sensitivity, and the second process of irradiating the imprint material R with the second light $L_2$ to which the imprint material R has the second reaction sensitivity lower than the first reaction sensitivity. The preliminary curing step is controlled such that the end timing of the second process is later than the end timing of the first process. By controlling the preliminary curing step using the first light $L_1$ and the second light $L_2$ as described above, it is possible to achieve both the alignment accuracy between the mold M and the substrate and the throughput.

Second Embodiment

The second embodiment according to present invention will be described. In the filling step (step S13), in order to rapidly fill the concave portion of the pattern of the mold M with the imprint material R, it is preferable that the viscosity of the imprint material R is as low as possible. Accordingly, the preliminary curing step of increasing the viscosity of the imprint material R is preferably executed after the filling step. Therefore, in this embodiment, the preliminary curing step is executed after the filling step (step S13) and in parallel with or before the alignment step (step S14). Note that this embodiment basically takes over the first embodiment, and the arrangement of an imprint apparatus 100 and the basic contents of an imprint process are as described in the first embodiment.

Figure 9:
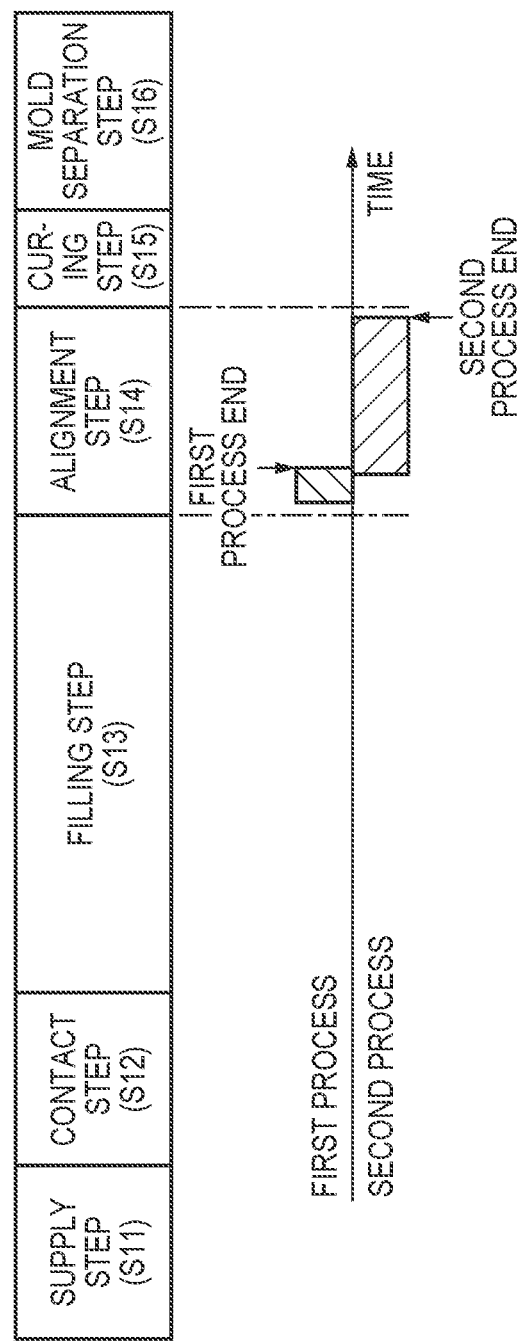
FIG. 9 is a timing chart showing a preliminary curing step (a first process and a second process) during the imprint process according to the second embodiment.

FIG. 9 is a timing chart showing the execution timing of a preliminary curing step (a first process and a second process) in the imprint process. In the example shown in FIG. 9, the preliminary curing step (the first process and the second process) is executed after a filling step (step S13) and in parallel with an alignment step (step S14). In the example shown in FIG. 9, the second process is executed after the first process ends. However, the present invention is not limited to this, and the first process and the second process may be controlled as in the example shown in each of cases A to E in FIG. 8. For example, in order to shorten the total time required for the preliminary curing step, both the first process and the second process may be started at the end timing of the filling step. In this case, the preliminary curing step can be also controlled such that the end timing of the second process is later than the end timing of the first process.

Here, the time required for the filling step can be determined in advance by an experiment, simulation, or the like. For example, for each of a plurality of conditions among which the time of the filling step is different, the number of defects generated in the finally cured imprint material R may be measured, and "the time required for the filling step" may be determined based on conditions that lead to the number of defects equal or smaller than a threshold value (preferably, to be the smallest number). Alternatively, a camera (spread camera) for observing the filling of the pattern concave portion of the mold M with the imprint material R may be provided, and the filling step may be terminated based on an image obtained by the camera.

According to this embodiment described above, the filling step (step S13) is executed in a state in which the viscosity of the imprint material R is low before irradiated with preliminary light Lp. Therefore, it is possible to rapidly fill the pattern concave portion of the mold M with the imprint material R, and this can be further advantageous in throughput.

Third Embodiment

The third embodiment according to the present invention will be described. In this embodiment, an example will be described in which a first process of irradiating an imprint material R with first light $L_1$ as preliminary light Lp is executed using a main curing unit 42 instead of using a first light source 41a of a preliminary curing unit 41. That is, in this embodiment, the same light source is used for the first light $L_1$ and curing light Lc. That is, light beams having the same wavelength are used for the first light $L_1$ and curing light Lc. Note that this embodiment basically takes over the first and second embodiments, and the arrangement of an imprint apparatus 100 and the basic contents of an imprint process are as described above.

Figure 10:
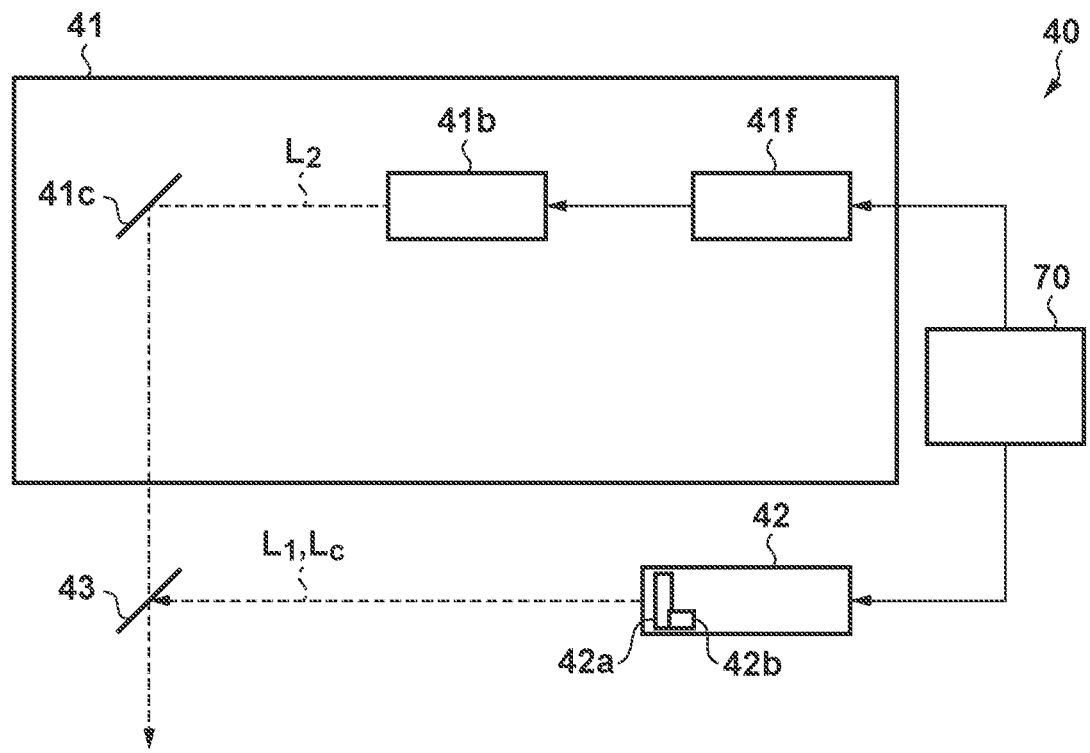
FIG. 10 is a schematic view showing an arrangement example of a curing device according to the third embodiment.

FIG. 10 is a schematic view showing an arrangement example of a curing device 40. The preliminary curing unit 41 according to this embodiment is not provided with the first light source 41a, a first driving unit 41e, and a half mirror 41d, and the first light $L_1$ is emitted by the main curing unit 42. For example, if the intensity of the light emitted from the main curing unit 42 is too high, a filter 42a such as an ND filter that adjusts (attenuates) the light intensity may be provided in the main curing unit 42, and the first light $L_1$ may be generated by the filter 42a. More specifically, when the first process in the preliminary curing step is executed, the filter 42a is arranged on the optical path by a driving mechanism 42b, so that the first light $L_1$ as the preliminary light Lp can be emitted from the main curing unit 42. On the other hand, when a main curing step (step S15) is executed, the filter 42a is removed from the optical path by the driving mechanism 42b, so that the curing light Lc can be emitted from the main curing unit 42.

Figure 11:
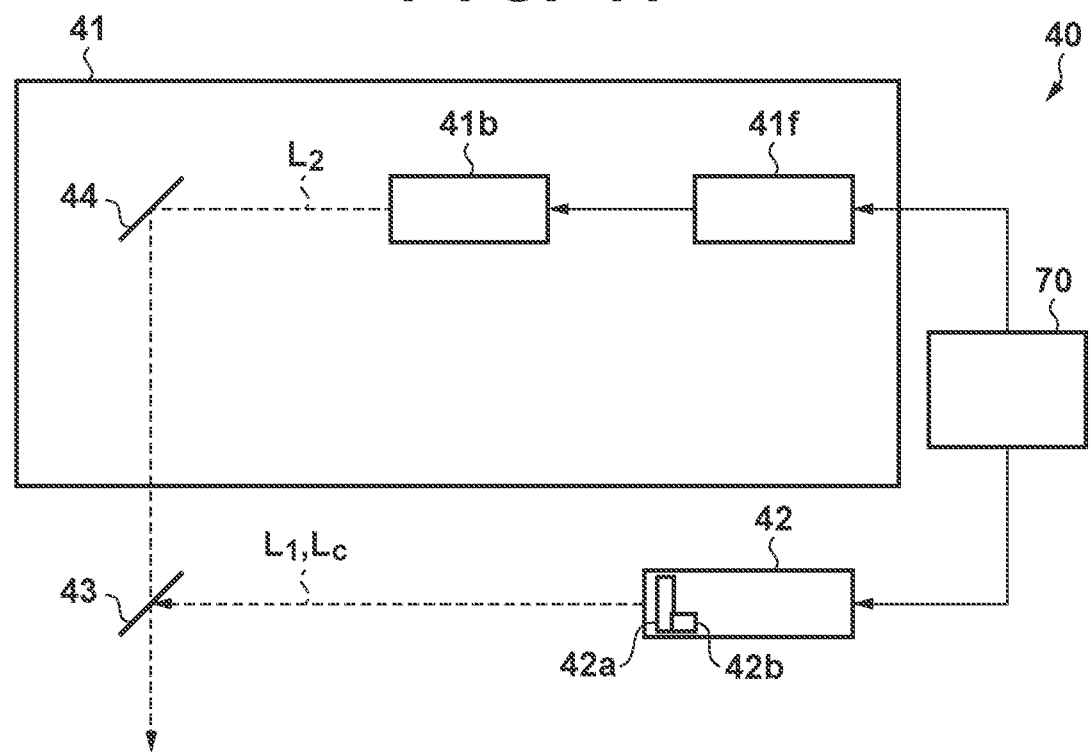
FIG. 11 is a schematic view showing a modification of the arrangement of the curing device according to the third embodiment.

Further, the preliminary curing unit 41 may be provided with a distribution control mechanism 44 (spatial light modulator) that spatially and temporally controls the illuminance distribution, on the substrate, of the second light $L_2$ emitted from the second light source 41b. As the distribution control mechanism 44, for example, an optical element such as a DMD (Digital Micro-mirror Device) or an LCD (Liquid Crystal. Display) can be used. When the DMD is used as the distribution control mechanism 44, as shown in FIG. 11, the distribution control mechanism 44 is arranged in place of a mirror 41c. When the distribution control mechanism 44 (DMD) is used to temporally and spatially control the second light $L_2$ emitted from a second light source 41b, as compared to a case in which current control of the second light source 41b is executed by a second driving unit 41f, ON/OFF control of the second light $L_2$ can be rapidly executed. As one example, the transient response speed of the second light source 41b is several hundred μsec. To the contrary, the pattern switching control in the DMD is executed sufficiently fast with respect to the transient response of the second light source 41b, and is completed in several tens of μsec. This can be advantageous in throughput.

In addition, since the second process using the distribution control mechanism 44 (DMD) can spatially and temporally control the illuminance distribution of the second light $L_2$, it is possible to partially apply the second light $L_2$ to a portion where the viscosity of the imprint material R is desired to be increased. It is also possible to change the illuminance of the second light $L_2$ for the portion where the viscosity of the imprint material R is desired to be increased and for the other portion. As one example, it is possible to change the illuminance of the second light $L_2$ for a portion of a pattern region Ma of a mold M, where filling of the imprint material R is easy, and for a portion where the filling of the imprint material R is difficult. Further, it is possible to efficiently irradiate, with the second light $L_2$, a region that can greatly contribute to a reduction of a vibration which influences the alignment between the mold M and a substrate W. Furthermore, by partially irradiating a periphery portion of a target shot region. S with the second light $L_2$, it is possible to reduce extrusion (protrusion) of the imprint material R from the target shot region S.

Embodiment of Method of Manufacturing Article

A method of manufacturing an article according to the embodiment of the present invention is suitable for manufacturing an article, for example, a microdevice such as a semiconductor device or an element having a microstructure. The method of manufacturing an article according to the embodiment includes a step of forming a pattern to an imprint material supplied (applied) onto a substrate by using the above-described imprint apparatus (imprint method) and a step of processing the substrate on which the pattern has been formed in the preceding step. Furthermore, this manufacturing method includes other well-known steps (for example, oxidization, deposition, vapor deposition, doping, planarization, etching, resist removal, dicing, bonding, and packaging, and the like). The method of manufacturing an article according to the embodiment is superior to a conventional method in at least one of the performance, quality, productivity, and production cost of the article.

The pattern of a cured material formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile or nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured material is directly used as the constituent member of at least some of the above-described articles or used temporarily as a resist mask. After etching or ion implantation is performed in the substrate processing step, the resist mask is removed.

Figure 12A:
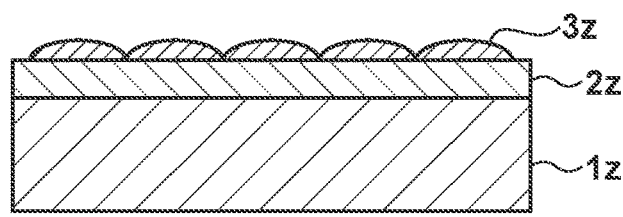
FIGS. 12A to 12F are views showing a method of manufacturing an article.

A detailed method of manufacturing an article will be described next. As shown in FIG. 12A, a substrate 1z such as a silicon wafer with a target material 2z to be processed such as an insulator formed on the surface is prepared. Next, an imprint material 3z is applied to the surface of the target material 2z by an inkjet method or the like. A state in which the imprint material 3z is applied as a plurality of droplets onto the substrate is shown here.

Figure 12B:
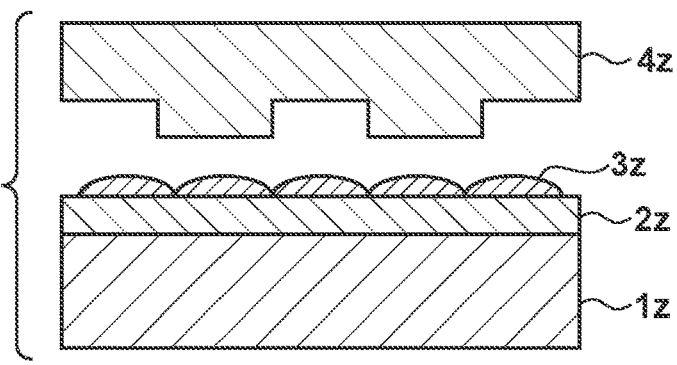
Figure 12C:
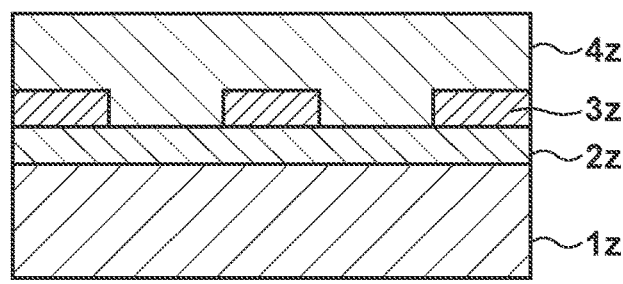

As shown in FIG. 12B, a mold 4z for imprint is caused to face to the substrate 1z such that a pattern with convex and concave portions formed in the mold 4z is directed to the imprint material 3z on the substrate 1z. As shown in FIG. 12C, the mold 4z and the imprint material 3z applied on the substrate 1z are brought into contact with each other, and subjected to a pressure. The gap between the mold 4z and the target material 2z is filled with the imprint material 3z. In this state, by irradiating the imprint material 3z with energy for curing through the mold 4z, the imprint material 3z is cured.

Figure 12D:
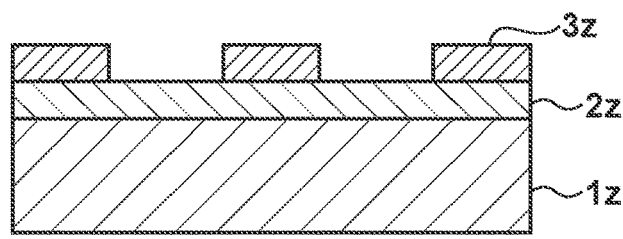

As shown in FIG. 12D, after the imprint material 3z is cured, the mold 4z is separated from the substrate 1z. Then, the pattern of the cured material of the imprint material 3z is formed on the substrate 1z. In the pattern of the cured material, the concave portion of the mold corresponds to the convex portion of the cured material, and the convex portion of the mold corresponds to the concave portion of the cured material. That is, the pattern with convex and concave portions in the mold 4z is transferred to the imprint material 3z.

Figure 12E:
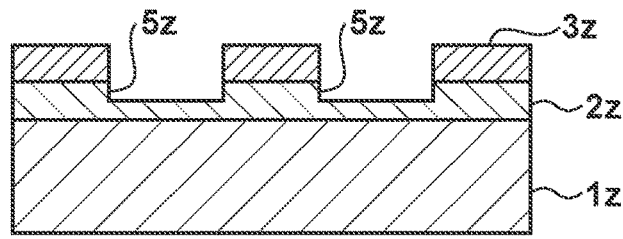
Figure 12F:
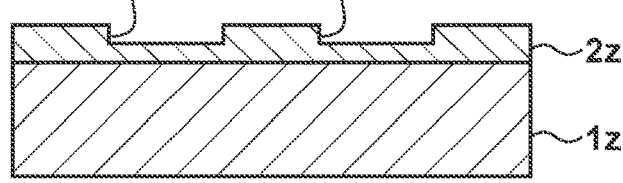

As shown in FIG. 12E, by performing etching process using the pattern of the cured material as an etching resistant mask, a portion of the surface of the target material 2z where the cured material does not exist or remains thin is removed to form a groove 5z. As shown in FIG. 12F, by removing the pattern of the cured material, an article with the grooves 5z formed in the surface of the target material 2z can be obtained. Here, the pattern of the cured material is removed. However, instead of processing or removing the pattern of the cured material, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-007019 filed on Jan. 20, 2020, which is hereby incorporated by reference herein in its entirety.

What is claimed is:

1. An imprint method of forming a pattern on an imprint material on a substrate using a mold, comprising:
    performing alignment between the mold and the substrate in a state in which the mold is in contact with the imprint material on the substrate;
    performing preliminary curing of, in parallel with the alignment or before the alignment, irradiating the imprint material with light to cure the imprint material to a first target hardness; and
    performing main curing of, after the alignment, irradiating the imprint material with curing light to cure the imprint material to a second target hardness higher than the first target hardness,
    wherein the preliminary curing includes a first process of irradiating the imprint material with first light to which the imprint material has first reaction sensitivity, and a second process of irradiating the imprint material with second light to which the imprint material has second reaction sensitivity lower than the first reaction sensitivity, and is controlled such that an end timing of the second process is later than an end timing of the first process, and
    wherein in the preliminary curing, the first process is controlled to end before the imprint material is cured to the first target hardness, and after the first process ends, the second process is controlled such that the imprint material is cured to the first target hardness by irradiating the imprint material with the second light.

2. The imprint method according to claim 1, wherein
    in the alignment, a relative position between the mold and the substrate is controlled such that a mark of the mold and a mark of the substrate have a target positional relationship, and
    in the main curing, the relative position between the mold and the substrate obtained in the alignment is set as a target relative position, and the relative position between the mold and the substrate is controlled so as to maintain the target relative position.

3. The imprint method according to claim 1, further comprising waiting until a pattern of the mold is filled with the imprint material,
    wherein the preliminary curing is executed after a pattern of the mold is filled with the imprint material.

4. The imprint method according to claim 1, wherein the second process is started after the first process ends.

5. The imprint method according to claim 1, wherein the second process is started such that at least a part of the second process temporally overlaps with the first process.

6. The imprint method according to claim 1, wherein in the first process, the imprint material is intermittently irradiated with the first light, and in the second process, the imprint material is intermittently irradiated with the second light.

7. The imprint method according to claim 1, wherein the first light and the second light are emitted from different light sources.

8. The imprint method according to claim 1, wherein the first light is emitted from a light source that emits the curing light.

9. A method of manufacturing an article, the method comprising:
    forming a pattern in a substrate by using an imprint method according to claim 1;
    processing the substrate, on which the pattern has been formed, to manufacture the article.

10. The imprint method according to claim 1, wherein
    the alignment is performed based on a result of measuring a positional relationship between a mark of the mold and a mark of the substrate, and
    the first light and the second light are different from light used for measuring the positional relationship.

* * * * *